US00RE37060E

(19) United States
(12) Reissued Patent
Sung et al.

(10) Patent Number: US RE37,060 E
(45) Date of Reissued Patent: Feb. 20, 2001

(54) APPARATUS FOR SERIAL READING AND WRITING OF RANDOM ACCESS MEMORY ARRAYS

(75) Inventors: Chiakang Sung, Milpitas; Wanli Chang, Saratoga; Joseph Huang, San Jose, all of CA (US)

(73) Assignee: Altera Corporation, San Jose, CA (US)

(21) Appl. No.: 09/010,384

(22) Filed: Jan. 21, 1998

Related U.S. Patent Documents

Reissue of:
(64) Patent No.: 5,555,214
Issued: Sep. 10, 1996
Appl. No.: 08/555,110
Filed: Nov. 8, 1995

(51) Int. Cl.[7] ..... G11C 7/00

(52) U.S. Cl. ..... 365/221; 365/189.02; 365/230.02; 365/239

(58) Field of Search ..... 365/221, 189.02, 365/189.12, 230.02, 230.09, 239

(56) References Cited

U.S. PATENT DOCUMENTS

| | | | |
|---|---|---|---|
| 3,566,153 | 2/1971 | Spencer, Jr. | 307/205 |
| 4,124,899 | 11/1978 | Birkner et al. | 364/716 |
| 4,347,587 | 8/1982 | Rao | 365/189 |
| 4,524,430 | 6/1985 | Page | 365/289 |
| 4,609,986 | 9/1986 | Hartmann et al. | 364/200 |
| 4,617,479 | 10/1986 | Hartmann et al. | 307/465 |
| 4,713,792 | 12/1987 | Hartmann et al. | 364/900 |
| 4,761,768 | 8/1988 | Turner et al. | 365/201 |
| 4,873,666 | 10/1989 | Lefebvre et al. | 365/221 |
| 4,930,107 | 5/1990 | Chan et al. | 365/189.08 |
| 5,128,559 | 7/1992 | Steele | 307/465 |
| 5,237,219 | 8/1993 | Cliff | 307/465 |
| 5,487,049 | 1/1996 | Hang | 365/221 |

FOREIGN PATENT DOCUMENTS

| | | |
|---|---|---|
| 0031950 | 7/1981 | (EP) . |
| 0116287 | 8/1984 | (EP) . |
| 0196771 | 10/1986 | (EP) . |
| 1345488 | 1/1974 | (GB) . |
| 2183374 | 6/1987 | (GB) . |
| WO87/07753 | 12/1987 | (WO) . |

OTHER PUBLICATIONS

Fletcher, W.I., et al., "Simplify Sequential Circuit Designs", *Electronic Design*, Jul. 8, 1971, pp. 70–72.

Hemel, A., "Making Small ROM's [sic] Do Math Quickly, Cheaply and Easily", *Electronics*, May 11, 1970, pp. 104–111.

Kambayashi, Y., "Logic Design of Programmable Logic Arrays", *IEEE Transactions on Computers*, vol. C–28, No. 9, Sep. 1979, pp. 607–617.

Kvamme, F., "Standard Read–Only Memories Simplify Complex Logic Design", *Electronics*, Jan. 5, 1970, pp. 88–95.

McMorrow, S., "In–circuit logic device can be reprogrammed on the fly," *Electronics Design*, vol. 34, No. 18, pp. 94–97 (Aug. 7, 1986).

Nichols, J.L., "A Logical Next Step for Read–Only Memories", *Electronics*, Jun. 12, 1967, pp. 111–113.

(List continued on next page.)

*Primary Examiner*—Son T. Dinh
(74) *Attorney, Agent, or Firm*—Fish & Neave; Jeffrey H. Ingerman

(57) ABSTRACT

A method of serially reading and writing random access memory arrays is provided. Although the read/write inputs continually change as programming data are clocked into the input buffers, a read/write control circuit prevents the constantly changing read/write inputs from causing undesired reading and writing.

40 Claims, 4 Drawing Sheets

OTHER PUBLICATIONS

Sholl, H.A., et al., "Design of Asynchronous Sequential Networks Using Read–Only Memories", *IEEE Transactions on Computers*, vol. C–24, No. 2, Feb. 1975, pp. 195–206.

Weinberger, A., "High–Speed Programmable Logic Array Adders", *IBM J. Res. Develop.*, vol. 23, No. 2, Mar. 1979, pp. 163–178.

Hu, S.C., "Cellular Synthesis of Synchronous Sequential Machines," *IEEE Transactions on Computers*, vol. C–21, No. 12, pp. 1399–1405 (Dec. 1972).

Page, III, E.W., "Programmable Array Realization of Sequential Machines," Doctoral Dissertation, Dept. of Electrical Engineering, Duke University (May 10, 1973).

APPARATUS FOR SERIAL READING AND WRITING OF RANDOM ACCESS MEMORY ARRAYS

Matter enclosed in heavy brackets [ ] appears in the original patent but forms no part of this reissue specification; matter printed in italics indicates the additions made by reissue.

BACKGROUND OF THE INVENTION

This invention relates to the serial programming of random access memory arrays, and particularly random access memory arrays contained within larger devices such that the number of input/output pins available for programming is limited.

Typically, in the programming of random access memory arrays, one provides the data to be stored and address information that indicates where in the array the data are to be stored. To read the array, the address of the locations desired would be provided. In addition, Output Enable and read/write control signals are typically provided. Typically, the programming data, address data, and control signals are fed in parallel to a buffer. Change of the read/write control signal to a write state then causes the programming data in the buffer to be written to the appropriate places in the array as determined by the address data.

A programming scheme such as that just described ordinarily is performed in parallel, requiring a large number of input/output (I/O) lines. For example, in the case of a 64×32-bit array, eleven (11) address lines are required—i.e., six lines for the 64-bit dimension ($2^6$=64) and five lines for the 32-bit dimension ($2^5$=32). In addition, the programming data are normally transferred in 8-bit bytes, necessitating another eight (8) lines, and the clock and control signals require at least two additional lines, for a total in that case of at least twenty-one (21) lines required for writing. The device is similarly read out into an output buffer, preferably under control of the same address lines as are used for input, when the read/write control signal changes to a read state. The output of the buffer is then read in parallel using, typically, eight lines. Thus, twenty-one lines are required for reading as well.

If the random access memory is a discrete memory device, the number of lines required for reading or writing is not of much concern, because the available I/O pins on the device are not required for other functions. However, random access memory arrays are frequently embedded in larger devices. For example, copending commonly-assigned U.S. patent application Ser. No. 08/442,795, filed May 17, 1995, which is hereby incorporated by reference in its entirety, describes a programmable logic device having a large number of interconnected programmable logic regions. In addition, there are a smaller number of random access memory regions embedded in the device (in that example, the random access memory is static random access memory). In that device, there is heavy competition for I/O pins, which must be shared by logic inputs and outputs, programming inputs, testing inputs and outputs, etc.

One way of reducing the number of pins required to access a large array device is to use serial techniques. For example, commonly-assigned U.S. Pat. No. 4,930,107 shows a method for serially programming an EPROM-type programmable logic device. However, where the array device is a random access memory, special considerations arise that may make serial programming more difficult.

For example, in the random access memory arrangement described above, programming, address and control data are input into a buffer, and written from the buffer into the random access memory on a change of state of the read/write control bit in the buffer. To serially program such a random access memory, one would serially load the input buffer, then flip the read/write control bit to a write state. If there is more than one array, their input buffers would be chained together and loaded in a single serial loading operation. The serially loaded data bits would be arranged so that at the end of the serial loading, the read/write control position of each buffer is in the write state, to cause writing into each array. However, the status of the read/write control bit in each buffer (except the last one) would change continually as the programming data are clocked in. Each time a bit representing the write state passed through the read/write control position of each buffer, the corresponding array would be written with unintended data. Even in the case of a single array, if the read/write control position is not the last position in the buffer, erroneous writing can occur. And even if the read/write control position is the last position, it still may not be desirable for writing to occur as soon as the intended write state bit reaches that read/write control position.

Reading of the random access memory occurs in a similar way. Specifically, address data are written into the input buffers and the read/write control bit or bits are changed to a read state, causing the data in the array that is identified by the address in the buffer to be written to output buffers which can then be read either serially or in parallel (again, to optimize pin allocations, serial reading would be preferred). Here again, as the address data are clocked in, unintended reading or writing may occur as the read/write control bit changes state.

It would be desirable to be able to provide for serial reading and writing of random access memory while preventing unintended reading and writing of the memory as data are clocked into the input buffers.

SUMMARY OF THE INVENTION

It is an object of this invention to provide for serial reading and writing of random access memory while preventing unintended reading and writing of the memory as data are clocked into the input buffers.

In accordance with the invention, there is provided serially progammable random access memory having at least one random access memory array. Each array includes a plurality of random access memory bits, a plurality of data input lines for entering data to be stored in the random access memory array, a plurality of address input lines and an address decoder for entering address information indicating in a write mode in which of the plurality of random access memory bits the data to be stored is to be stored and for indicating in a read mode which of the plurality of random access memory bits are to be output from the random access memory array, and a read/write control input. The random access memory array is in a read mode when a read/write control signal applied to the read/write control input is in a first logic state and is in a write mode when the read/write control signal applied to the read/write control input is in a second logic state. For each of the at least one random access memory array, a set of input/programming registers is connected to the data input lines, the address input lines and the read/write control input, for inputting programming data for the random access memory array, which programming data include the address information and a registered control signal to be applied to the read/write control input, as well as the data to be written when the input/programming registers are used for writing. The input/ programming registers are chained together such that the data to be stored, the address information and the registered control signal can be entered serially into the registers. A read/write control circuit allows selective operation of the at least one random access memory array in one of (a) a first mode in which the random access memory array is in one of (i) a read mode, and (ii) a write mode, regardless of the registered control signal, and (b) a second mode in which the random access memory array is in one of (i) a read mode, and (ii) a write mode, under control of the registered control signal.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
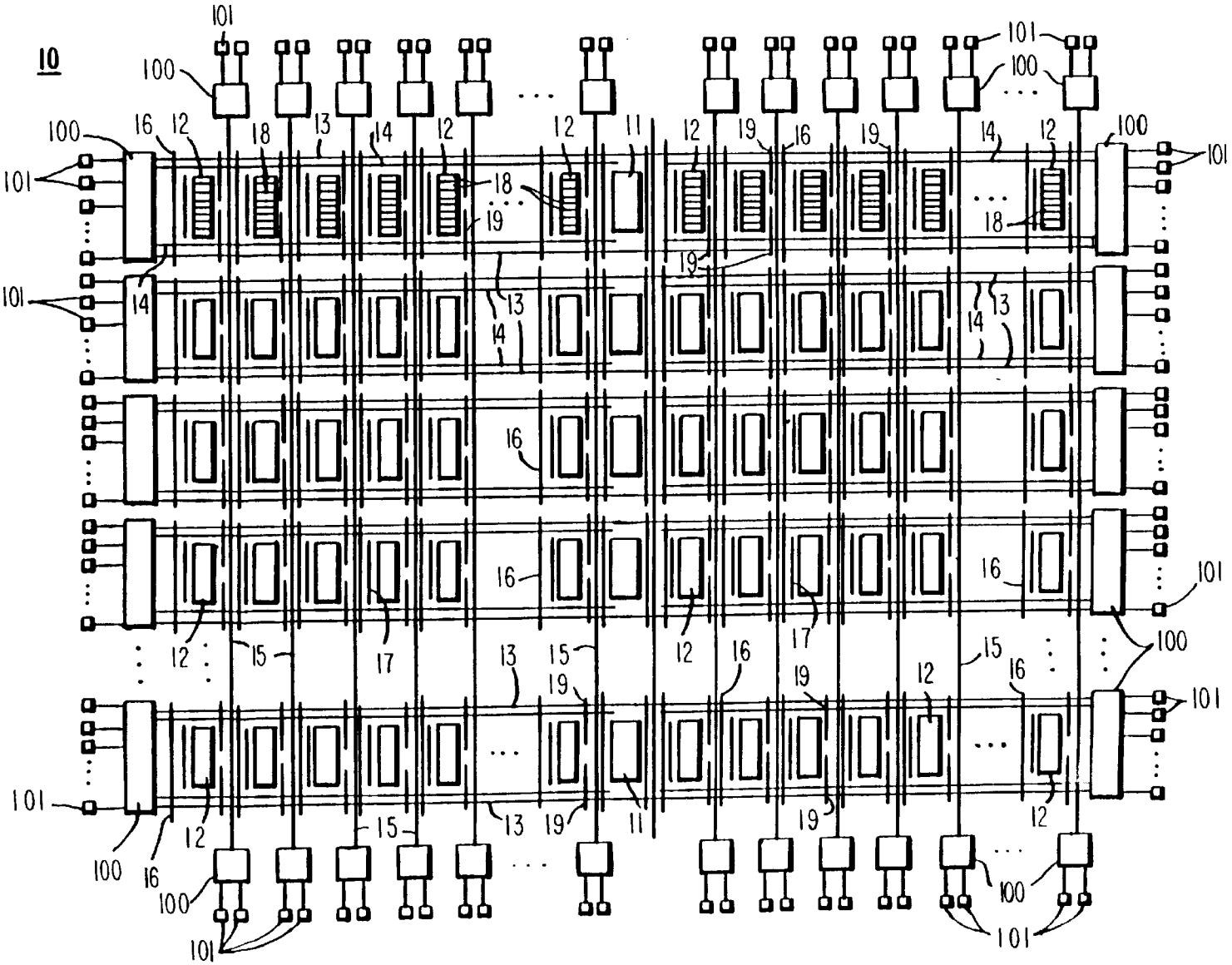
FIG. 1 is a high-level diagram of a programmable logic device including embedded random access memory configured according to the present invention.

The present invention allows for serial reading and writing of random access memory without unintended reading and writing as the state of the read/write control bit changes during the serial clocking of programming data. (As used herein, "programming data" means the data that are clocked into the random access memory input registers for reading or writing the random access memory, including address and control data which are used for either reading or writing, as well as data to be stored when in the write mode.) The invention accomplishes that result by interposing, between the read/write control register and the random access memory array, a read/write control circuit that allows the user to override the read/write control register during serial loading of the input registers.

The read/write control circuit preferably is a multiplexer having two data inputs and a control input. One data input is the output of the read/write control register. The other data input is a read/write mode selection signal which is applied to an I/O pin of the device by the user (or by some other device or circuit according to the design of the user) during the clocking of programming data into the random access memory input registers (and possibly at other times as discussed below). The control input is a read/write option signal applied to an I/O pin by the user (or by some other device or circuit according to the design of the user) during the clocking of programming data into the random access memory input registers (and possibly at other times as discussed below).

When data are to be clocked into the input registers to read or write the random access memory, the user would apply (or cause to be applied), to the read/write option input of the read/write control circuit, a signal that causes the read/write control circuit to select, as the read/write control input to the random access memory, the read/write mode selection signal rather than the contents of the read/write control register. The user would then apply (or cause to be applied) to the read/write mode selection input a signal that will keep the random access memory in read mode.

In a preferred embodiment of the invention, the read/write control input to the random access memory array is a Read/Not-Write input. That is, the array is in a read state when the Read/Not-Write input is high (a logic "1"), and in a write state when the Read/Not-Write input is low (a logic ")"). In that embodiment, the read state of the signal applied to the read/write mode selection input would be a logic "1." It should be understood, however, that the read/write control input could be implemented in other ways, such as a Not-Read/Write input in which a logic "0" is the read state and a logic "1" is the write state. Other arrangements for read/write control might also be used.

There is normally no reason why the user would want the read/write mode selection signal to keep the random access memory in write mode. Therefore, the read/write mode selection input could be kept permanently in a read state—e.g., it could be tied high in a Read/Not-Write embodiment or tied low in a Not-Read/Write embodiment. The read/write option input alone would then determine whether the random access memory is in a read state, or in a state determined by the read/write control register. However, there may be applications where the user would want to force the random access memory into a write state, and such applications can be accomplished by applying the desired signal (in the Read/Not-Write example, a logic "0") to the read/write mode selection input while selecting that input using the read/write option signal.

The invention thus provides a way to serially clock programming data into the input registers of a random access memory without the random access memory being rewritten every time a bit in the "write" state (a logic "0" in the example) is clocked through the read/write control register.

The invention can be further described with reference to FIGS. 1–4.

FIG. 1 shows, as an example of a device with which the present invention can be used, a programmable logic device 10 having embedded random access memory. It should be recognized, however, that the present invention can be used with random access memory alone, or with random access memory that is part of some other kind of device.

As can be seen, device 10 has a plurality of random access memory arrays 11, which are arranged in one column on device 10. The remaining columns of device 10 are populated by programmable logic regions 12. Each row has two groups of horizontal interconnection conductors 13 that extend the entire length of the row, one group of conductors 13 being above the row and the other group being below the row. Conductors 13 are sometimes referred to as full-horizontal conductors or as global horizontal conductors. Each row also has four groups of horizontal interconnection conductors 14 that extend along half the length of the row. Two of these groups extend respectively along the top and bottom of the left half of the row. The other two groups of these conductors 14 extend respectively along the top and bottom of the right half of the row. The conductors 14 associated with each half of a row are preferably not directly connectable to the conductors 14 associated with the other half of the row. Conductors 14 are sometimes referred to as half-horizontal conductors. Each column of regular logic regions 12 has a group of vertical interconnection conductors 15 that extend continuously or substantially continuously along the entire length of the column.

In order to feed logic signals to each region 12, each regular logic region has an associated plurality of region feeding conductors 16 that can bring signals to the logic region from the horizontal conductors 13 and 14 associated with that region. Each region 12 also has eight associated local feedback conductors 17. Each conductor 17 makes the output signal of a respective one of the logic modules 18 in the associated region 12 available as an input to any of the other logic modules in that region without having to use any interconnection resources that are not exclusively associated with the region.

Each region 12 also has output conductors 19 for conveying the output logic signals of the logic modules 18 in that region to the associated conductors 13 and 14. Programmable logic connectors ("PLCs") (not shown) are associated with each regular logic region 12 for making connections from the vertical (15) to the horizontal (13 and 14) conductors associated with the region. A plurality of output networks 100 connect the various conductors 13–15) to input/output pins 101.

As can be seen, many resources are competing for access to I/O pins 101, hence the desire, as discussed above, to minimize the number of I/O pins 101 required in order to carry out serial reading and writing of random access memory arrays 11. That minimization is achieved as discussed below.

Figure 2:
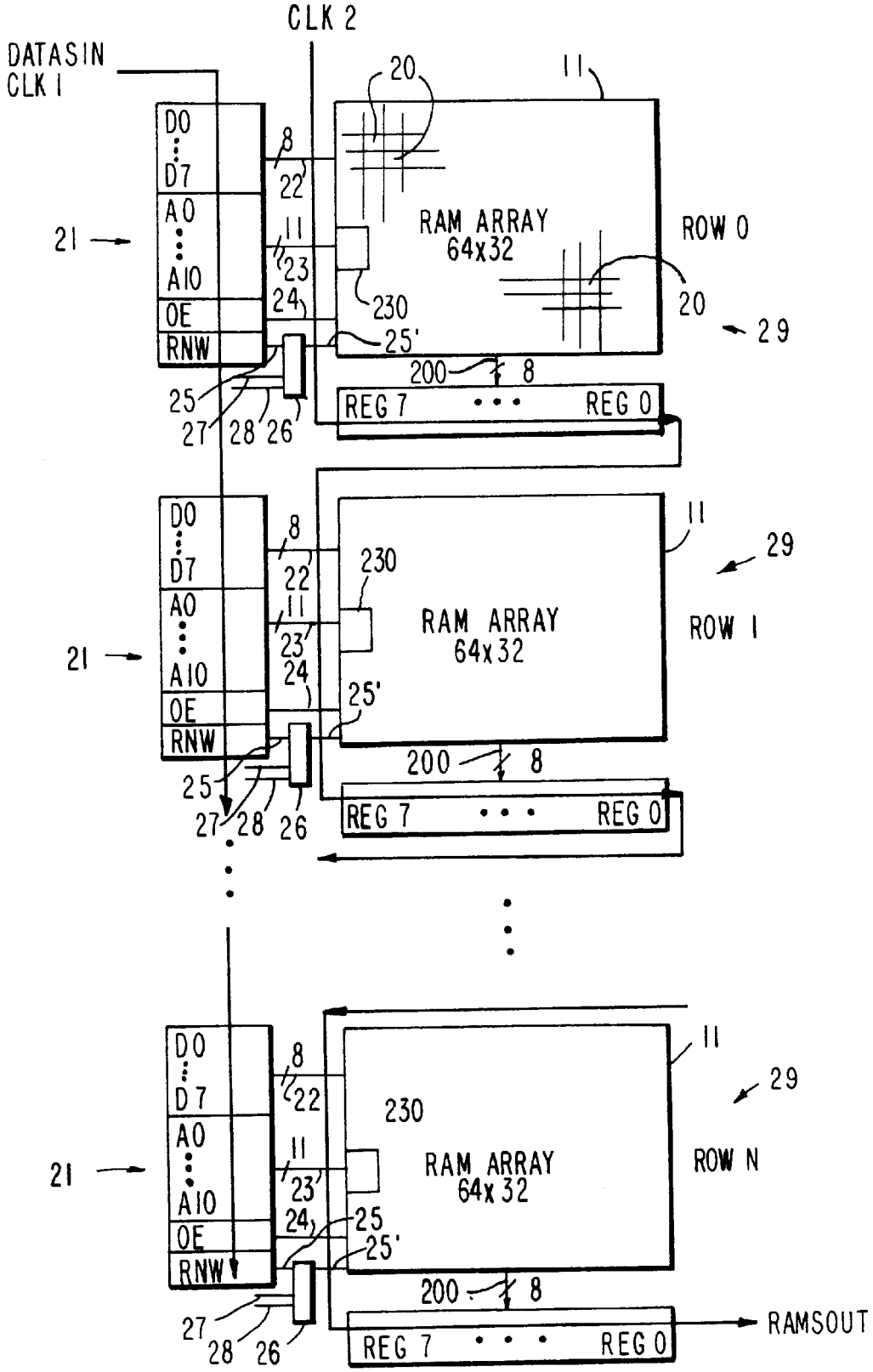
FIG. 2 is a block diagram of a plurality of random access memory arrays configured according to the present invention.

In FIG. 2, N random access memory arrays 11 are depicted schematically as 64×32-bit arrays, arranged in N rows of a single column. Preferably, arrays 11 are static random access memory arrays, but the invention applies equally to dynamic random access memory. Representative bits 20 are shown schematically scattered throughout the uppermost one of arrays 11 (in Row 0). Associated with each array 11 is an input buffer 21 made up of a plurality of registers. In the illustrative embodiment shown, input buffer 21 includes twenty-one registers—eight data registers D0–D7, eleven address registers A0–A10, an Output Enable (OE) register and a read/write control register implemented as a Read/Not-Write (RNW) register. Buffer 21 is connected to array 11 by eight data inputs 22, eleven address inputs 23, and an Output Enable input 24. Buffer 21 also has a read/write control output 25 which is switched by read/write control circuit 26. Read/write control circuit 26 is also fed by read/write mode selection input 27 and read/write option input 28. The output of read/write control circuit 26 feeds read/write control input 25 of array 11.

Each array 11 preferably also has an associated output buffer 29 preferably made up of eight output registers Reg 0–Reg 7, each of which is preferably connected to array 11 by one of preferably eight outputs 200.

Figure 3:
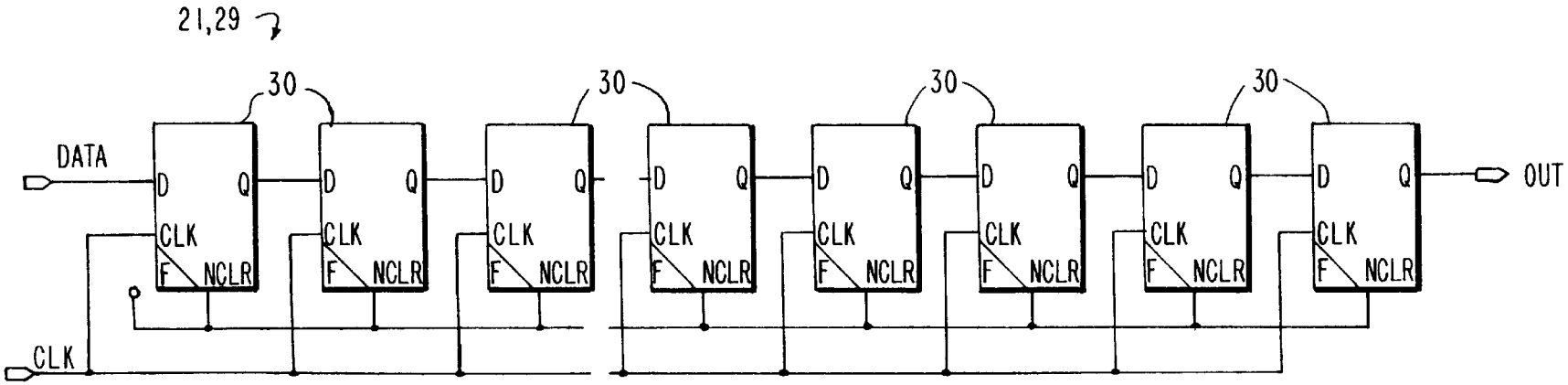
FIG. 3 is a block diagram of an example of a serial register configuration according to the present invention.

The registers of buffer 21 and the registers of buffer 29 preferably are positive edge trigger D-type flip-flops 30 connected serially as shown in FIG. 3. Buffers 21 are preferably connected together serially as indicated by arrows A, with the last register in each buffer 21 connected to the first register in the next buffer 21 in the same manner as the individual registers of each buffer 21. Similarly, buffers 29 are preferably connected together serially as indicated by arrows B, with the last register in each buffer 29 connected to the first register in the next buffer 29 in the same manner as the individual registers of each buffer 29.

Figure 4:
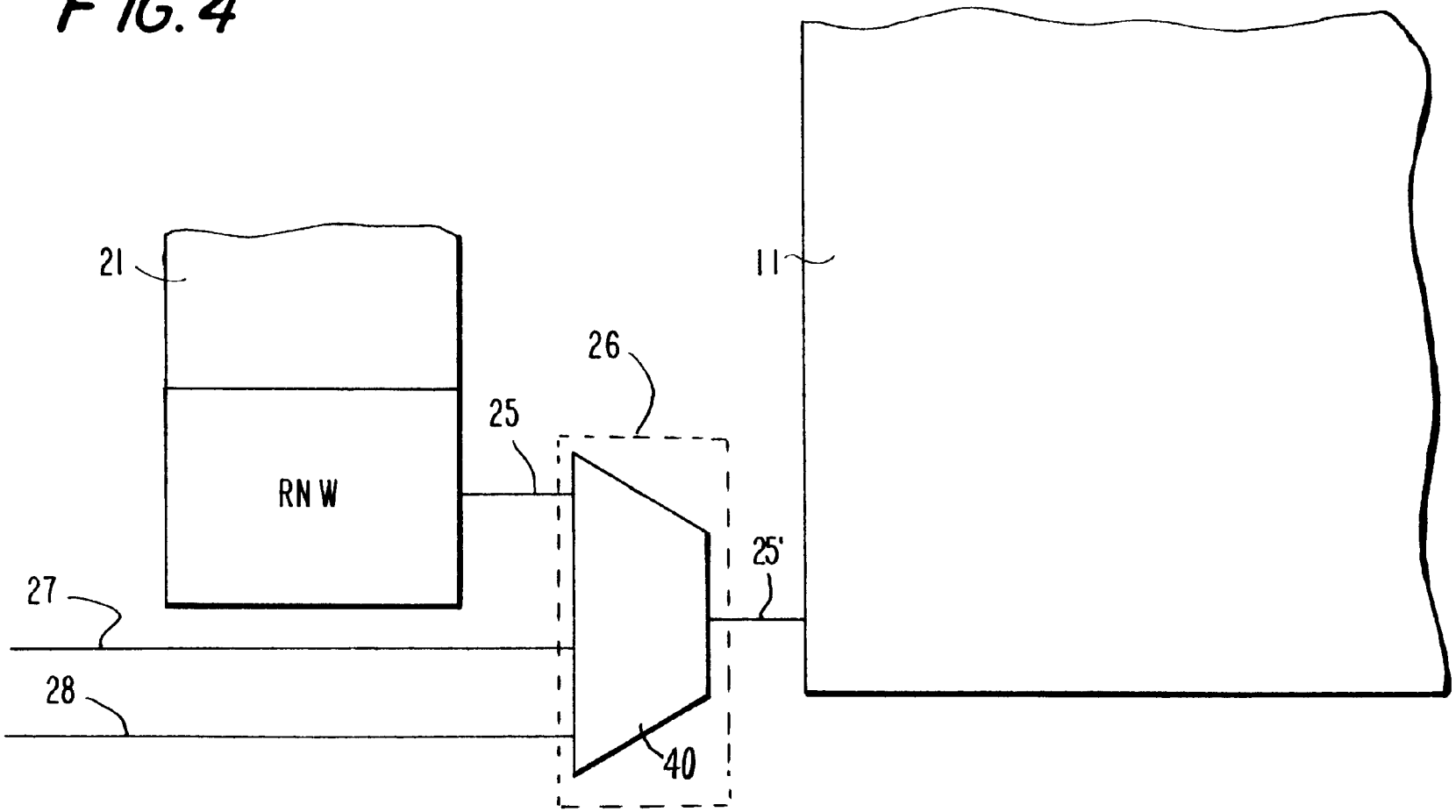
FIG. 4 is a block diagram of a read/write control arrangement according to the present invention.

FIG. 4 shows detail of read/write control circuit 26. As can be seen, read/write control circuit 26 is preferably a multiplexer 40, fed by read/write control output 25 of the RNW register of buffer 21 (*as a first data input*), by read/write mode selection input 27 (*as a second data input*), and by read/write option input 28 (*as a control input*), the latter two preferably being fed by appropriate ones of pins 101.

In operation, the user, or a circuit or software under the direction or control of the user, would arrange a string of programming bits that are clocked into buffers 21 serially under the control of clock signal CLK1 from input DATASIN, both preferably fed from appropriate pins 101. The string of bits would be arranged so that after being clocked into buffers 21, the desired bit would be present in each of the registers of buffers 21 to accomplish the desired read or write operation. For a read operation in the embodiment shown, in addition to arranging the data and address bits, the user would arrange that each bit in each RNW register is a logic "1," while for a write operation in that embodiment, the user would arrange that each bit in each RNW register is a logic "0." As the programming data are clocked into buffers 21, the user would activate read/write control circuit 26 by applying a signal on read/write option input 28 (e.g., from an appropriate pin 101) to cause multiplexer 40 to feed read/write mode selection signal 27, rather than read/write control output signal 25, to read/write control input 25' of array 11. The user would also apply a logic "1" to read/write mode selection input 27 (e.g., from an appropriate pin 101). As stated above, in the embodiment shown the user most likely will never want input 27 to be anything other than a logic "1," and so it could be permanently held high, with all control based on input 28. After the data have been clocked into buffers 21, the user will change input 27 to a state that causes multiplexer 40 to select output 25. For a write operation in the embodiment shown the logic "0's" in registers RNW will then be applied to inputs 25', and the data in respective sets of registers D0–D7 will be written to the locations specified by the data in respective sets of registers A0–A11, which are decoded by an address decoder 230 shown schematically as being part of random access memory array 11, although it could be a separate circuit between registers A0–A10 and random access memory array 11.

For a read operation, the logic "1's" in registers RNW would be applied by circuit 26 to inputs 25', and the data in array locations specified by the data in respective sets of registers A0–A11 will be written to respective sets of registers Reg 0–Reg 7 in output buffers 29. The data can then be read by clocking them out on line RAMSOUT under control of clock signal CLK2.

In a programmable logic device, a write operation would most likely be used to load random access memory arrays 11 to function as look-up tables or other logic devices, which during normal operation would probably be accessed in a way that directs individual outputs to different parts of the device. Therefore, the serial output or read mode just described would probably be used only for testing (by the manufacturer or the user), although other uses would be possible. And if the random access memory were being used alone or in some other application, the serial read and write modes can be used as desired.

As described, the present invention allows serial reading and writing of relatively large random access memory arrays using preferably only six pins—CLK1, CLK2, DATASIN, RAMSOUT, read/write mode selection input 27 and read/write option input 28. Indeed, if read/write mode selection input 27 is permanently held high (or low) as discussed, the number of pins needed can be reduced to five.

Thus it is seen that serial reading and writing of random access memory is provided, while preventing unintended reading and writing of the memory as data are clocked into the input buffers. One skilled in the art will appreciate that the present invention can be practiced by other than the described embodiments, which are presented for purposes of illustration and not of limitation, and the present invention is limited only by the claims which follow.

What is claimed is:

1. Serially programmable random access memory comprising:

at least one random access memory array including:

a plurality of random access memory bits, a plurality of data input lines for entering data to be stored in said random access memory array, a plurality of address input lines and an address decoder for entering address information indicating in a write mode in which of said plurality of random access memory bits said data to be stored are to be stored, and for indicating in a read mode which of said plurality of random access memory bits are to be output from said random access memory array, and a read/write control input, said random access memory array being in a read mode when a read/write control signal applied to said read/write control input is in a first logic state and being in a write mode when said read/write control signal applied to said read/write control input is in a second logic state;

for each said at least one random access memory array, a set of input/programming registers connected to said data input lines, said address input lines and said read/write control input for inputting programming data for said random access memory array, said programming data including said address information and a registered control signal to be applied to said read/write control input, and including said data to be written when said input/programming registers are used for writing, said input/programming registers being chained together such that said programming data can be entered serially into said registers; and a read/write control circuit for selectively operating said at least one random access memory array in one of (a) a first mode in which said random access memory array is in one of (i) a read mode, and (ii) a write mode, regardless of said registered control signal, and (b) a second mode in which said random access memory array is in one of (i) a read mode, and (ii) a write mode, under control of said registered control signal.

2. The serially programmable random access memory of claim 1, wherein:

said at least one random access memory array comprises a plurality of said random access memory arrays; said serially programmable random access memory further comprising:

a corresponding plurality of said at least one set of input registers.

3. The serially programmable random access memory of claim 2 wherein said plurality of sets of input registers are chained together for serial input of said programming data for said plurality of said random access memory arrays.

4. The serially programmable random access memory of claim 1 wherein said at least one random access memory array comprises static random access memory.

5. The serially programmable random access memory of claim 1 wherein said read/write control circuit comprises a selector circuit having:

a first input connected to one of said input registers corresponding to said registered control signal;

a second input for a read/write mode selection signal; and a third input for a read/write option signal; wherein:

when said read/write option signal is in a first logic state, said read/write control circuit selects said first input as said read/write control input; and when said read/write option signal is in a second logic state, said read/write control circuit selects said second input as said read/write control input.

6. The serially programmable random access memory of claim 5 wherein said selector circuit comprises a multiplexer.

7. The serially programmable random access memory of claim 5 further comprising:

a first input pin for said programming data;

a second input pin for said read/write option signal; and a third input pin for said read/write mode selection signal.

8. The serially programmable random access memory of claim 1 wherein:

said at least one random access memory array further comprises a plurality of data output lines for outputting data stored in said random access memory array; said serially programmable random access memory further comprising:

for each said at least one random access memory array, a set of output registers connected to said data output lines for, when said at least one random access memory array is operated in a read mode, outputting from said random access memory array said data stored in said random access memory array, said output registers being chained together such that said data stored in said random access memory array can be output serially from said registers.

9. The serially programmable random access memory of claim 8 wherein:

said at least one random access memory array comprises a plurality of said random access memory arrays; said serially programmable random access memory further comprising:

a corresponding plurality of said at least one set of output registers.

10. The serially programmable random access memory of claim 9 wherein said plurality of sets of output registers are chained together for serial output of said data stored in said plurality of random access memory arrays.

11. A programmable logic device comprising a plurality of configurable logic circuits, serially programmable random access memory, and interconnect resource connecting said configurable logic circuits and said serially programmable random access memory, said serially programmable random access memory comprising:

at least one random access memory array including:

a plurality of random access memory bits, a plurality of data input lines for entering data to be stored in said random access memory array, a plurality of address input lines and an address decoder for entering address information indicating in a write mode in which of said plurality of random access memory bits said data to be stored are to be stored, and for indicating in a read mode which of said plurality of random access memory bits are to be output from said random access memory, and a read/write control input, said random access memory array being in a read mode when a read/write control signal applied to said read/write control input is in a first logic state and being in a write mode when said read/write control signal applied to said read/write control input is in a second logic state;

for each said at least one random access memory array, a set of input/programming registers connected to said data input lines, said address input lines and said read/write control input for inputting programming data for said random access memory array, said programming data including said address information and a registered control signal to be applied to said read/write control input, and including said data to be written when said input/programming registers are used for writing, said input/programming registers being chained together such that said programming data can be entered serially into said registers; and a read/write control circuit for selectively operating said at least one random access memory array in one of (a) a first mode in which said random access memory array is in one of (i) a read mode, and (ii) a write mode, regardless of said registered control signal, and (b) a second mode in which said random access memory array is in one of (i) a read mode, and (ii) a write mode, under control of said registered control signal.

12. The programmable logic device of claim 11, wherein:

said at least one random access memory array comprises a plurality of said random access memory arrays; said serially programmable random access memory further comprising:

a corresponding plurality of said at least one set of input registers.

13. The programmable logic device of claim 12 wherein said plurality of sets of input registers are chained together for serial input of said programming data for said plurality of said random access memory arrays.

14. The programmable logic device of claim 11 wherein said at least one random access memory array comprises static random access memory.

15. The programmable logic device of claim 11 wherein said read/write control circuit comprises a selector circuit having:

a first input connected to one of said input registers corresponding to said registered control signal;

a second input for a read/write mode selection signal; and a third input for a read/write option signal; wherein:

when said read/write option signal is in a first logic state, said read/write control circuit selects said first input as said read/write control input; and when said read/write selector signal is in a second logic state, said read/write control circuit selects said second input as said read/write control input.

16. The programmable logic device of claim 15 wherein said selector circuit comprises a multiplexer.

17. The programmable logic device of claim 15 further comprising:

a first input pin for said programming data;

a second input pin for said read/write option signal; and a third input pin for said read/write mode selection signal.

18. The programmable logic device of claim 11 wherein:

said at least one random access memory array further comprises a plurality of data output lines for outputting data stored in said random access memory array; said serially programmable random access memory further comprising:

for each said at least one random access memory array, a set of output registers connected to said data output lines for, when said at least one random access memory array is operated in a read mode, outputting from said random access memory array said data stored in said random access memory array, said output registers being chained together such that said data stored in said random access memory array can be output serially from said registers.

19. The programmable logic device of claim 18 wherein:

said at least one random access memory array comprises a plurality of said random access memory arrays; said serially programmable random access memory further comprising:

a corresponding plurality of said at least one set of output registers.

20. The programmable logic device of claim 19 wherein said plurality of sets of output registers are chained together for serial output of said data stored in said plurality of random access memory arrays.

*21. An apparatus comprising:*

*a memory array including a plurality of storage locations; and*

*a serial register, coupled to said memory array, said serial register including:*

*a first field configured to store an address corresponding to one of said plurality of memory locations in said memory array;*

*a second field configured to store control information used to control access to said memory array, said control information indicating a write operation when said control information is in a first state and a read operation when said control information is in a second state; and*

*a third field configured to store data to be written into said one of said plurality of memory locations corresponding to said address stored in said first field when said control information is in said first state.*

*22. The apparatus of claim 21 further comprising a clock circuit configured to generate a clock signal to clock said address, said control information, and said data into said first field, said second field and said third field, respectively, of said serial register.*

*23. The apparatus of claim 22 further comprising a control circuit coupled between said serial register and said memory array, said control circuit configured to selectively provide to said memory array either said control information from said serial register during a registered access of said memory array or a second control signal during a non-registered access of said memory array.*

*24. The apparatus of claim 23 wherein said second control signal originates from a source external to said apparatus.*

*25. An apparatus comprising:*

*a memory array including a plurality of memory locations; and*

*a serial register coupled to said memory array, said serial register including:*

*a first field configured to store an address corresponding to one of said plurality of memory locations in said memory array; and*

*a second field configured to store control information used to control access to said one of said plurality of memory locations in said memory array corresponding to said address in said first field of said serial register.*

*26. The apparatus of claim 25 further including a clock circuit which generates a clock signal used to synchronize transfer of said address and said control information into said serial register.*

*27. The apparatus of claim 25 further comprising a control circuit coupled between said serial register and said memory array, said control circuit configured to provide to said memory array either said control information in said second field of said serial register or a second control signal from a source external to said apparatus.*

*28. The apparatus of claim 27 further including a clock circuit which generates a clock signal used to synchronize transfer of said address and said control information into said serial register.*

*29. The apparatus of claim 27 wherein said control circuit is configured to provide said control information in said serial register to said memory array during a registered access of the memory array.*

*30. The apparatus of claim 27 wherein said control circuit is configured to provide said second control signal to said memory array during a non-registered access of said memory array.*

*31. The apparatus of claim 25 wherein said serial register further includes a data field which is configured to store data to be written into said memory array during a write operation.*

*32. The apparatus of claim 25 wherein said control information includes information to control a write operation to said memory array.*

*33. The apparatus of claim 25 wherein said control information includes information to control a read operation of said memory array.*

*34. The apparatus of claim 25 wherein said control circuit is a multiplexer.*

*35. The apparatus of claim 25 wherein said control information is used to control a write operation of said memory array when said control information is in a first state.*

*36. The apparatus of claim 25 wherein said control information is used to control a read operation of said memory array when said control information is in a second state.*

*37. The apparatus of claim 25 further comprising a parallel-to-serial register coupled to said memory array, said parallel-to-serial register configured to receive parallel data read from said memory array and to convert said parallel data into a serial data stream.*

*38. The apparatus of claim 25 further comprising an address decoder coupled to said serial register, said address decoder configured to decode said address stored in said first field of said serial register.*

*39. The apparatus of claim 25 wherein said memory array and serial register are provided on a programmable logic device.*

*40. The apparatus of claim 39 wherein said programmable logic device is contained in a data processing system.*

* * * * *